United States Patent
Palm et al.

(10) Patent No.: US 12,033,909 B2
(45) Date of Patent: Jul. 9, 2024

(54) DIE PACKAGE AND METHOD OF MANUFACTURING A DIE PACKAGE

(71) Applicant: Infineon Technologies AG, Neubiberg (DE)

(72) Inventors: Petteri Palm, Regensburg (DE); Angela Kessler, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 463 days.

(21) Appl. No.: 16/909,575

(22) Filed: Jun. 23, 2020

(65) Prior Publication Data

US 2020/0402881 A1 Dec. 24, 2020

(30) Foreign Application Priority Data

Jun. 24, 2019 (DE) .......................... 102019116928.3

(51) Int. Cl.
*H01L 23/31* (2006.01)
*H01L 21/56* (2006.01)
*H01L 25/07* (2006.01)

(52) U.S. Cl.
CPC ........ *H01L 23/3142* (2013.01); *H01L 21/561* (2013.01); *H01L 21/568* (2013.01); *H01L 25/072* (2013.01)

(58) Field of Classification Search
None
See application file for complete search history.

(56) References Cited

U.S. PATENT DOCUMENTS

| | | |
|---|---|---|
| 2006/0273451 A1 | 12/2006 | Kawabata et al. |
| 2012/0168938 A1 | 7/2012 | Gan et al. |
| 2014/0175624 A1* | 6/2014 | Palm ..................... H01L 23/495 438/118 |
| 2015/0287691 A1 | 10/2015 | Chou et al. |
| 2016/0197034 A1 | 7/2016 | Sun |
| 2017/0154856 A1* | 6/2017 | Standing ............... H01L 23/051 |

FOREIGN PATENT DOCUMENTS

| | | |
|---|---|---|
| DE | 102013114472 A1 | 6/2014 |
| DE | 102016107031 A1 | 10/2017 |

* cited by examiner

*Primary Examiner* — Jay C Chang
(74) *Attorney, Agent, or Firm* — Murphy, Bilak & Homiller, PLLC

(57) ABSTRACT

A die package is provided. The die package may include a laminated carrier including at least one recess, a first die having a frontside, a backside, a frontside metallization on the frontside and a backside metallization on the backside, wherein the first die is arranged in the at least one recess, a first encapsulating material partially encapsulating the first die, by covering at least the frontside metallization or the backside metallization, and an adhesion promoter material between the metallization covered by the first encapsulation material and the first encapsulation material and in direct physical contact with the first encapsulation material and the metallization covered by the first encapsulation material.

16 Claims, 10 Drawing Sheets

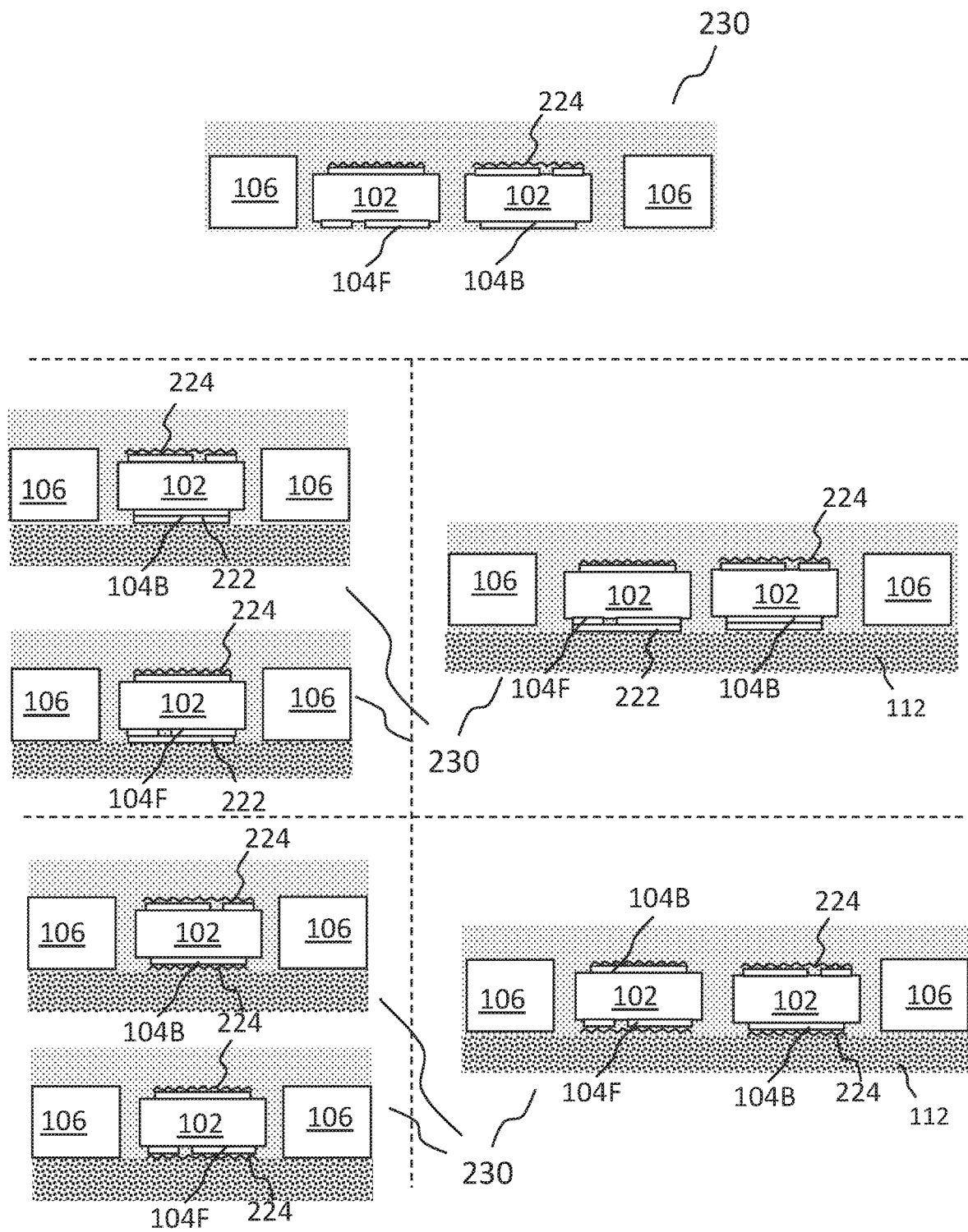

DIE PACKAGE AND METHOD OF MANUFACTURING A DIE PACKAGE

TECHNICAL FIELD

Various embodiments relate generally to a die package and to a method of manufacturing a die package.

BACKGROUND

In die packages, in particular laminated die packages, for example double sided chip embedding products (CE), an adhesion between a metallization of a semiconductor die/chip and an encapsulating material (for example a PCB laminate material) may be weaker than desired.

Attempts to solve the problem include for example adding an additional polyimide layer on the metallization. However, this makes it necessary to later drill through the polyimide passivation, and to remove residues with a desmear process before a subsequent plating process, which may be complicated or even impossible. Furthermore, the polyimide may only be applied to the die front side, and thus may not be able to provide a solution for a die package that includes two or more dies mounted with different orientations, i.e. one die with its frontside facing a carrier and the other die with its backside facing the carrier.

Another attempt includes a so-called Cu roughening, which means a roughening of a copper surface, which was possible because the dies were first diffusion soldered onto a copper (Cu) leadframe, and the leadframe with the chip could be subjected to, e.g., a wet chemical process for the roughening and before the lamination process without damaging the leadframe. However, other chip embedding processes may be more complicated. For example, the roughening of a die front side (or, more generally, the side that is facing down during bonding) may only be possible after a first lamination process, but it may be risky, because the laminate material may be only partially cured after the first lamination and may thus get damaged during the roughening process. Also, the roughening may be impossible to do to the backside of the die (or, more generally, the side that is facing down during bonding).

For a current CE chip embedding process flow, no actual solution exists for increasing an adhesion of both die surfaces, i.e. of a frontside and of a backside.

SUMMARY

A die package is provided. The die package may include a laminated carrier including at least one recess, a first die having a frontside and a backside and a frontside metallization on the frontside and a backside metallization on the backside, wherein the first die is arranged in the at least one recess, a first encapsulating material partially encapsulating the first die covering at least the frontside metallization or the backside metallization, and an adhesion promoter material between the metallization covered by the first encapsulation material and the first encapsulation material and in direct physical contact with the first encapsulation material and the metallization covered by the first encapsulation material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5A and FIG. 5B each shows die packages in accordance with various embodiments;

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

In current CE products, a major challenge may be an adhesion between a laminate material and a copper metallization on a die back- and front side. It is well known that the adhesion between relatively smooth die copper and PCB laminate material is relatively low.

Due to a process flow that is used in chip embedding products with double sided vias, a Cu roughening process that may be used in the PCB industry to guarantee good adhesion between a chip metallization and a PCB laminate material may not be used for both sides of the embedded die.

Figure 1:
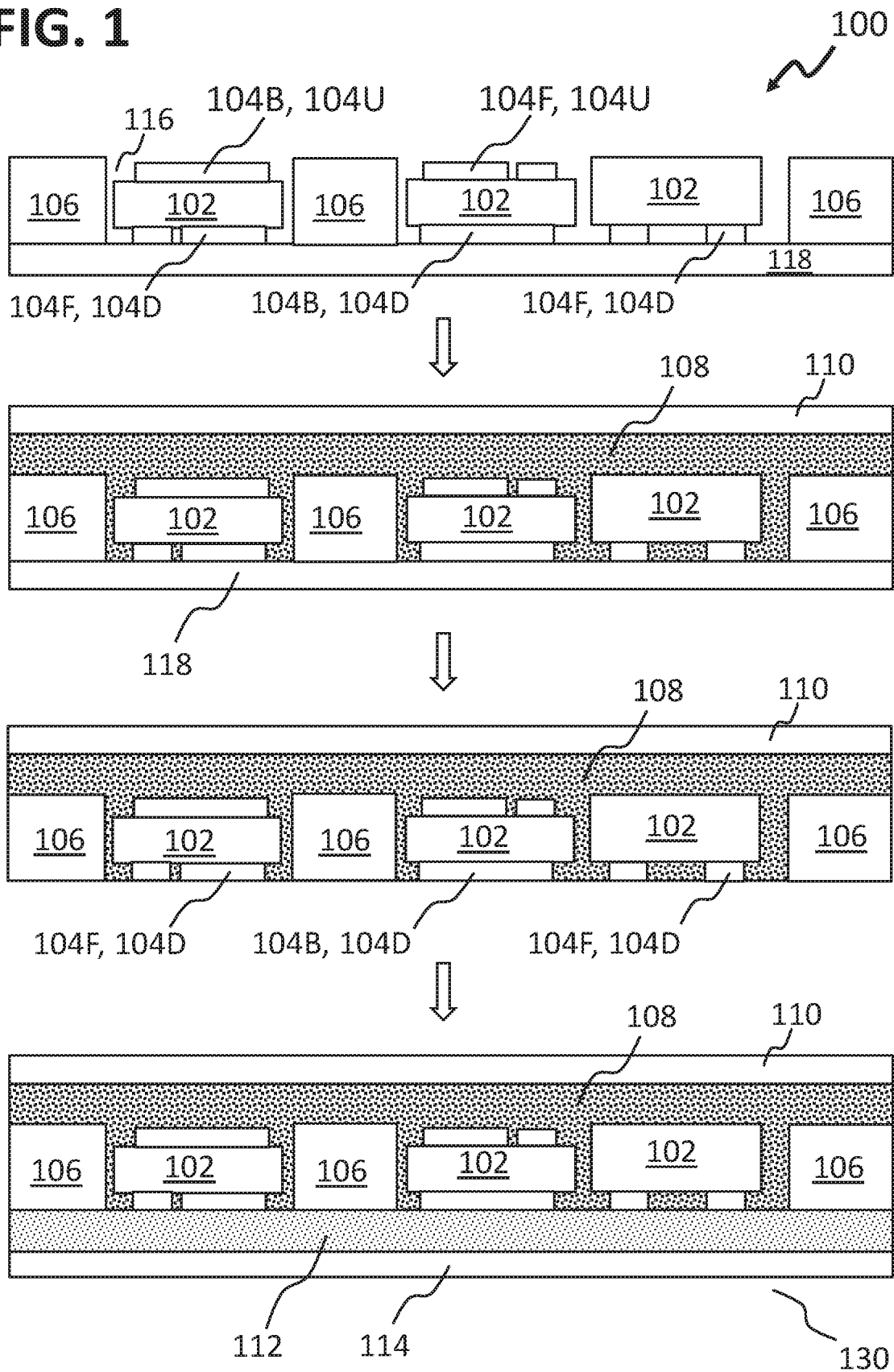
FIG. 1 illustrates a method of forming a die package.

FIG. 1 shows a schematic drawing illustrating a current second-generation CE process. A premanufactured core layer 106 with openings 116 for dies 102 to be embedded is manufactured, and a UV release tape 112 (or similar) is laminated onto a bottom side of the core layer 106. The dies 102 are placed inside the cavity 116 and bonded to the tape so that a backside copper 104B of one of the dies 102, e.g. a high-side (HS) MOSFET, a frontside metallization 104F of another one of the dies 102, e.g. a low-side (LS) MOSFET, and a frontside metallization 104F of a third of the dies, e.g. a driver die 102, are facing toward the tape 112 (top panel). After die 102 placement, a prepreg 108 and copper foil 110 are prelaminated onto a top side of the core layer 106 (second panel), and the tape 112 is removed (third panel). After this process, the backside metallization 104B of the LS MOSFET 102 and the front side metallization 104E of the LS MOSFET 102 are covered with the prepreg 108 and the copper 110 layers and are therefore inaccessible for roughening. In the current process flow and available PCB processes, this is the first possible phase to perform a roughening of a backside 104B of the HS MOSFET 102, the front side 104F of the LS MOSFET, and the front side 104F of the driver, but because the prepreg 108 is not fully cured at this phase, a risk of possible cracking, delamination or other problems during the handling and wet chemical process may be high.

In various embodiments, techniques are described for improving an adhesion in a double-sided chip embedding product (CE).

In various embodiments, a cost-effective solution is provided to improve chip-to-package interfaces, i.e. an adhesion at the interfaces, that can be used in these chip embedding packages.

In various embodiments, the process to improve the adhesion between the die and the laminate material is divided into two processes that allow that both sides of the dies 102, i.e. front- and backside, can be treated with a process that increases adhesion. The adhesion promoter processes may be executed either at wafer level or during a PCB manufacturing process.

In various embodiments, processes that are not used in normal chip embedding processes or in PCB industry may be used to improve an adhesion between a die metallization and a package material in chip embedding packages. Mainly, it may be a combination of known existing adhesion promoters or protective layers with the $CE^2$ process flow. In detail, the process to improve the adhesion between the die front side and back side to the laminate are done in two steps. These new processes, which are currently not used in CE packages, may either be applied between front end processes or between embedding processes, which will be described in more detail in the following detailed description.

In various embodiments, a process for improving the adhesion may be applied at the wafer level phase, either to the die front side or to the die back side, or after die placement when the dies are placed inside the core layer and bonded to the tape (die back side) or after softlam, when the dies are fixed to the Cu core with semi cured prepreg material (die front side).

The improved adhesion may in various embodiments be achieved by modifying the die metallization surface by chemical activation or by protecting it with a temporary or a thin permanent surface protection layer. Possible processes to improve adhesion include chemical activation of the chip surface by chemical reaction, preventing reoxidation of copper (Cu) and stabilizing a thin good adhering copper oxide (CuO) layer, removing the oxide layer and protecting the Cu surface, pretreatment of the surface e.g. using plasma, for example to obtain an activation of the surface by reducing the surface energy, and/or a mechanical interaction (state of the art, also referred to as Cu roughening or, more generally, roughening), which may increase a surface area between an encapsulation material (e.g. resin) and the Cu and may also lead to an interlocking of resin to Cu. An adhesion promoter material that may be applied, e.g. as a surface coating, for example using atomic layer deposition or an A2 process, may be organic or inorganic. It may for example include or consist of a silane.

Figure 2A:
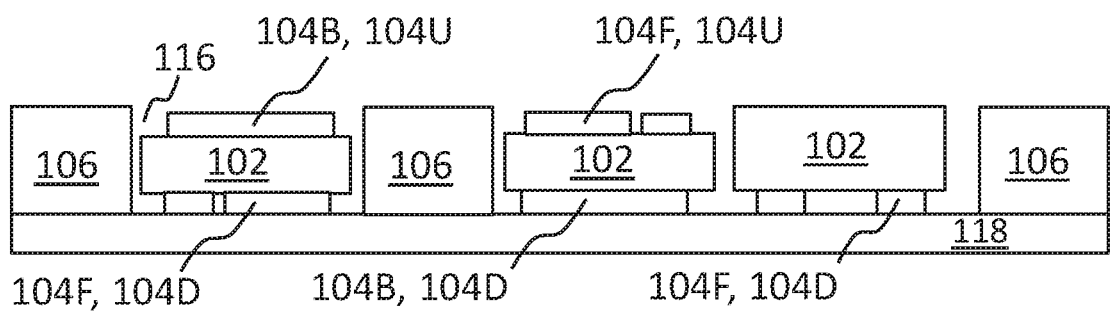
FIG. 2A and FIG. 2B illustrate a method of forming a die package in accordance with various embodiments.
Figure 2A:
Figure 2A:
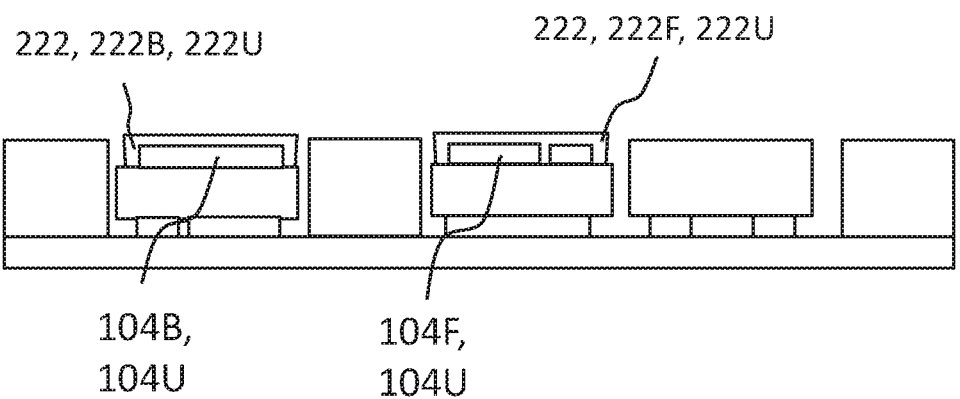
Figure 2A:
Figure 2A:
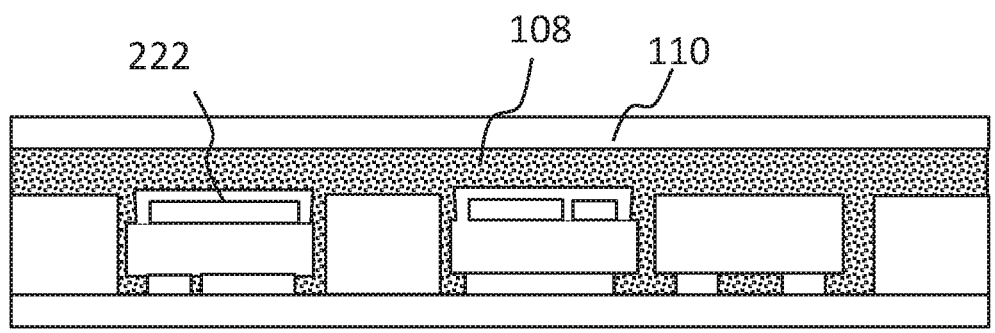
Figure 2A:
Figure 2B:
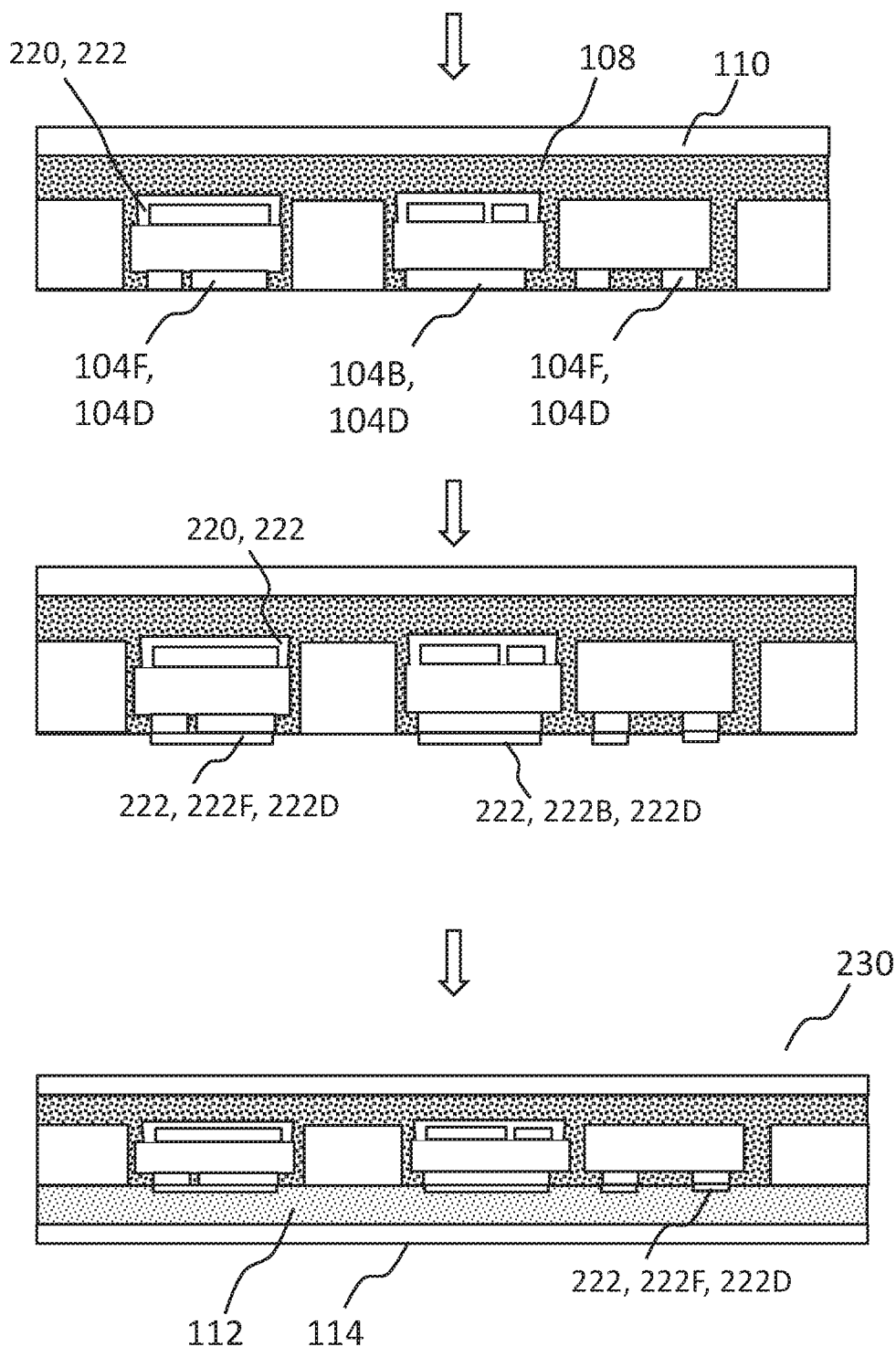

FIG. 2A and FIG. 2B illustrate a method of forming a die package in accordance with various embodiments.

The method may include placing a first die 102 having a frontside and a backside and a frontside metallization 104F on the frontside and a backside metallization 104F on the backside into at least one recess 116 of a laminated carrier 106 onto a removable carrier 118. This is shown in the top panel of FIG. 2A and FIG. 2B.

The first die 102 may for example be a semiconductor die, which may for example form a (power) semiconductor device, for example a (power) transistor or the like. A frontside of the die 102 may include a control contact of the die 102, and both, the frontside and the backside may have controlled contacts of the die 102.

The exemplary embodiment shown in FIG. 2A and FIG. 2B may include three dies 102, two of which include both, a frontside metallization 104F and a backside metallization 104F. The die 102 on the left may be a low-side MOSFET, the middle die 102 may be a high-side MOSFET, and the die 102 on the right may be a driver die for the two MOSFETs.

More generally, the method may optionally further include arranging a second die 102 having a frontside and a backside and a frontside metallization 104F on the frontside and a backside metallization 104B on the backside in the at least one recess 116, which may be the same recess 116 in which the first die 102 is arranged or a separate recess 116.

In various embodiments, the second die 102 may be arranged with its backside facing a bottom of the at least one recess 116, wherein the first die 102 is arranged in the at least one recess 116 with its frontside facing the bottom of the at least one recess 116. In other words, the first die 102 and the second die 102 may be arranged with different orientations, one flipped with respect to the other. In various embodiments, the first die 102 and the second die 102 may be arranged with the same orientation, in other words both frontsides facing the removable carrier 118 or both backsides facing the removable carrier 118.

The frontside metallization 104F and/or the backside metallization 104B (also referred to as the metallizations 104) may include or consist of copper. Another reference system for the metallizations 104 takes into account how the die 102 is placed inside the recess 116: The metallization 104 arranged facing the removable carrier 118 (i.e. downward) may be labelled as metallization 104D, and the metallization 104 arranged facing away from the removable carrier 118 (i.e. upward) may be labelled as metallization 104U.

The recess 116 may extend all the way through the laminated carrier 106. The laminated carrier 106 may include or consist of a carrier material for a printed circuit board (PCB), for example FR4, or it may include or consist of a copper laminate, or any other known suitable laminated carrier material.

The method may further include surface-treating the metallization facing away from the removable carrier 118 (in FIG. 2A and FIG. 2B, this is the backside metallization 104B of the leftmost die 102, and the frontside metallization 104F of the middle die 102, both of which now forming metallizations 104U). The surface-treating, as shown in FIG. 2A and FIG. 2B in the second panel, may include forming adhesion promoter material 222 onto the metallization 104U facing away from the removable carrier 118.

The adhesion promoter material 222 may in various embodiments include or consist of at least one inorganic material, for example ZnCr or aluminum oxide, e.g. applied using atomic layer deposition. In various embodiments, the adhesion promoter material 222 may include or consist of at least one organic material, for example an epoxy, a silane, benzotriazole, imidazole, benzimidazole.

The adhesion promoter material 222 may be applied selectively to the metallization 104U, or it may be applied to structures other than the metallization 104U, for example the semiconductor material of the die 102, and/or the laminated carrier 106. An adhesion between the semiconductor material and an encapsulation material 108 and/or between the laminated carrier 106 and the encapsulation material 108 may also be increased.

The adhesion promoter material 222 may for example be applied by spraying or by dipping. In a case of applying the adhesion promoter material 222 only to the metallization 104U, and not to the other materials, a mask may be used.

In various embodiments, in a case of having two or more dies 102 (like in FIG. 2A and FIG. 2B), the adhesion promoter material 222 may be applied to the two or more metallizations 104U simultaneously, or at least during the same process.

The method may further include partially encapsulating the first die 102 such that the first encapsulating material 108 covers at least the metallization 104U facing away from the removable carrier 118.

The first encapsulating material 108 may for example include or consist of a material typically used for PCB lamination, for example a prepreg laminate material. In various embodiments, the initial lamination process may lead to a partially cured state and may have to be treated by a final curing process to reach its ultimate stability. In other embodiments, the first encapsulating material 108 may be fully cured directly after the laminating.

In various embodiments, a metal layer 110, e.g. a copper layer, may be arranged over the first encapsulating material 108, for example during the same process as the first encapsulating material 108.

The method may further include removing the removable carrier 118 to expose at least a portion of the metallization 104D facing the removable carrier 118, as shown in the top panel of FIG. 2B, where the frontside metallization 102F of the first die 102 (the low-side MOSFET), the backside metallization 104B of the middle die 102 (the high-side MOSFET) and the frontside metallization 102F of the third die 102 (the driver die) are exposed.

The removing may for example be achieved by illuminating the removable carrier 118 with ultraviolet light if a UV-release-adhesive had been used for attaching the removable carrier 118. Other suitable known techniques may be used for removing the removable carrier 118, or a tape with sufficiently low adhesion may be used as the removable carrier 118.

The exposed portion of the metallization 104D may in various embodiments include a full surface of the metallization 104D, for example as shown in FIG. 2A and FIG. 2B, or only a fraction of the metallization 104D.

In various embodiments, the metallization 104D may be free from the adhesion promoter material 222 and may not be roughened. In various embodiments, the metallization 104D may be roughened, for example as described in context with FIG. 3A and FIG. 3B.

In a case of the exposed metallization 104D neither including the adhesion promoter material nor being roughened, the method may further include surface-treating the exposed portion of the metallization 104D by forming further adhesion promoter material 222 onto the exposed portion of the metallization 104D (as shown in FIG. 2B in the middle panel), and/or by roughening a surface of the exposed portion of the metallization 104D.

The method may further include arranging a second encapsulating material 112 over the surface-treated metallization 104D. A type of encapsulating material, a method of arranging ist, etc., may be similar or identical to what was described above in context with the first encapsulating material 108.

In various embodiments (not shown as a process, but FIG. 5A, middle section, and FIG. 5B, bottom section, show die packages 230 that may be a result of the process), instead of arranging the encapsulating material 108, the exposed portion of the metallization 104D may be roughened, for example by etching. In the figures, a roughened surface is indicated by a zigzag line and labelled with 224.

As will be described further in context with FIG. 3A and FIG. 3B, the metallization 104U facing away from the removable carrier 118 may be roughened (e.g., instead of being provided with the adhesion promoter material 222).

The roughening may for example include or consist of etching.

The roughened metallization surface 224 may the surface of the metallization facing away from the removable carrier after the roughening has a surface roughness between about 150 nm and about 2 µm, wherein the surface roughness may for example be measured in terms of maximum height surface roughness. The minimum targeted surface roughness may be in a range of about 150 to 200 nm (Rz), and an optimal roughness to achieve high adhesion may be in the range of about 0.5 to 2 µm (Rz).

The roughened surface 224 may have (microscopic) openings and protrusions and may thereby provide structures in which the encapsulating material 108, 112 may partially be arranged during the encapsulating process, thereby interlocking the encapsulating material 108, 112 and the roughened metallization surface 224. This means that a physical/mechanical adhesion may be increased. In various embodiments, a protective layer, for example an oxidation protection layer, may be arranged over the roughened surface 224.

Each of the frontside metallization 104F of the first die 102 and the backside metallization 104B of the second die 102 may have a surface that is in direct physical contact with the second encapsulating material 112 and may be roughened, and/or may have a further adhesion promoter material 222 arranged between the surface and the second encapsulation material 112 and in direct physical contact with the second encapsulation material 112.

In various embodiments, an adhesion of the adhesion promoter material 222 onto the metallization 104U and/or 104D, respectively, may be further increased by plasma treating the metallization 104U and/or 104D, respectively, to reduce a surface energy of a surface of the metallization 104U, 104D.

In various embodiments (not shown), in a case of the exposed metallization 104D neither including the adhesion promoter material 222 nor being roughened, the exposed metallization 104D may be treated by sputter depositing a metal layer on the exposed portion of the metallization 104D.

Figure 3A:
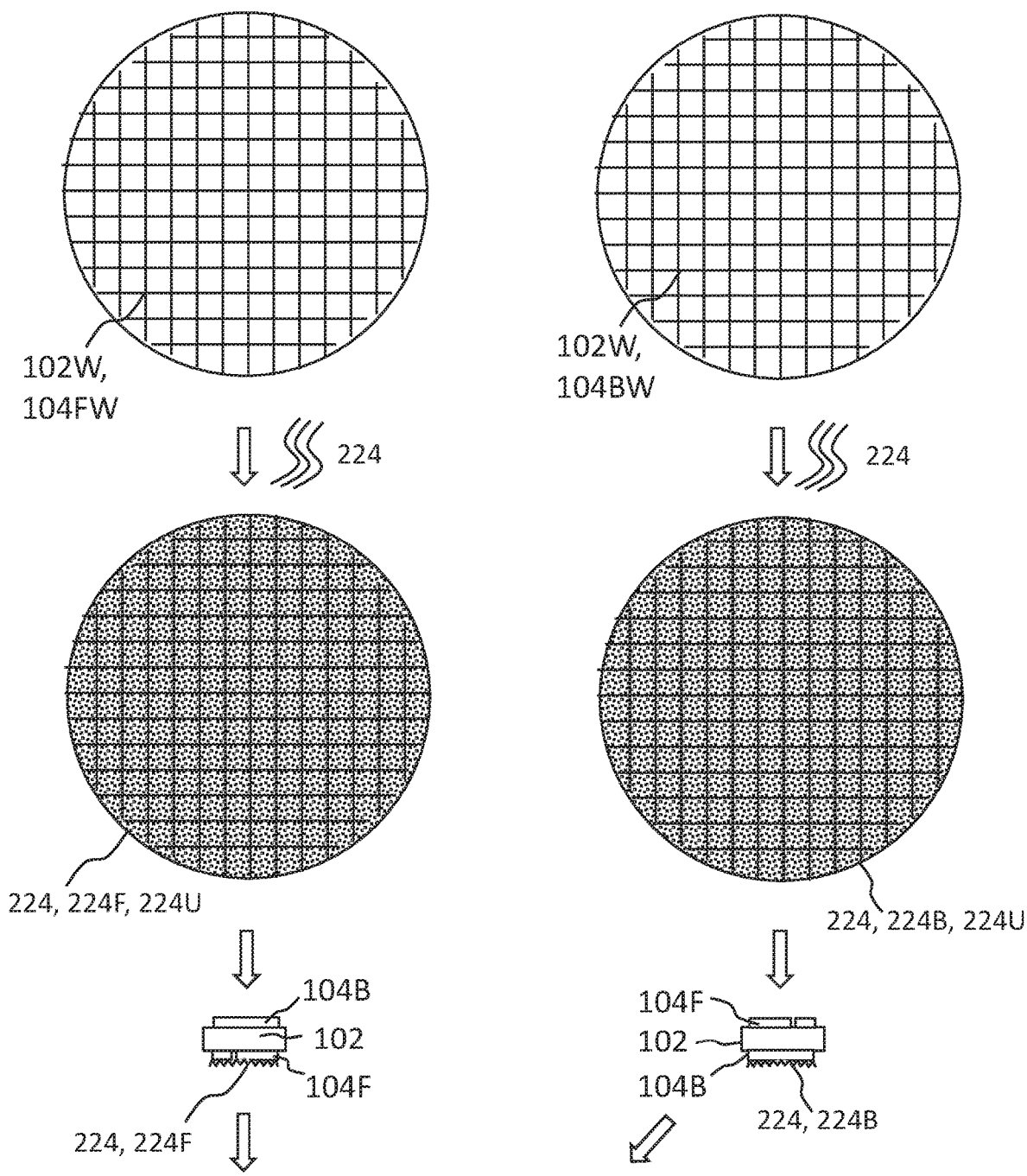
FIG. 3A and FIG. 3B illustrate a method of forming a die package in accordance with various embodiments.
Figure 3B:
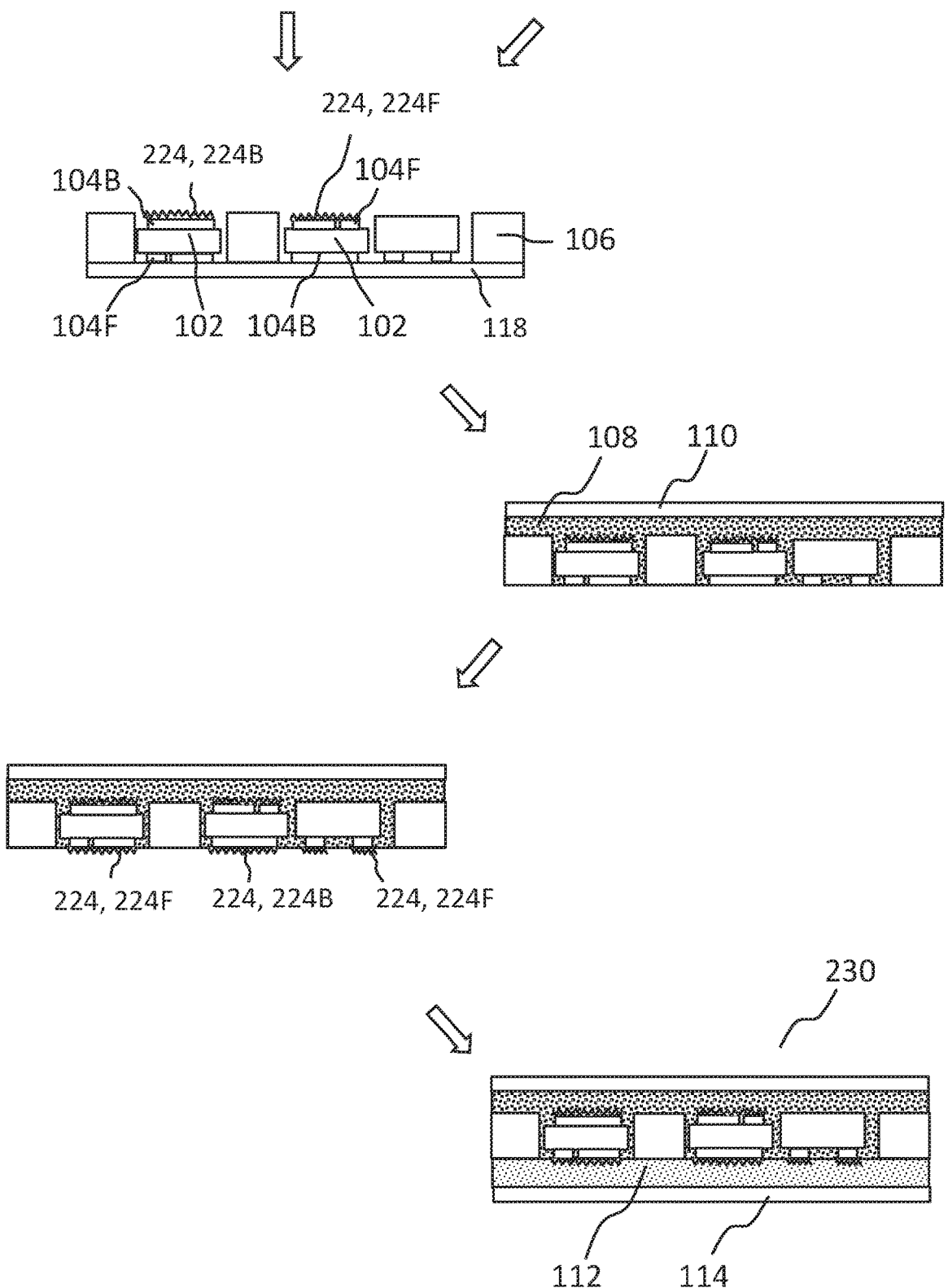

In various embodiments, some of which are illustrated in FIG. 3A and FIG. 3B, the surface-treating the metallization 104U facing away from the removable carrier 118 may be performed while the die 102 is part of a wafer 102W. In other words, the metallization 104U that will later be arranged facing away from the removable carrier 118 may be part of a wafer 102W surface having the metallization 104BW or 104FW, respectively, which may be surface treated, for example roughened or provided with the adhesion promoter material 222 (in FIG. 3A and FIG. 3B, it is roughened, thereby forming the roughened metal surfaces 224U either as the front side of the wafer 102W with the roughened metallization 224F, or as the back of the wafer 102W with the roughened metallization 224B).

The method of manufacturing the die package 230 shown in FIG. 3A and FIG. 3B may include providing the wafer 102W including the plurality of dies 102, each of the dies having the frontside and the backside and the frontside metallization 104F on the frontside and the backside metallization 104B on the backside (top panel of FIG. 3A). The wafer 102W on the left is shown with its frontside (and hence frontside metallization 104FW up, the wafer 102W on the right with its backside, and hence its backside metallization 104BW up. Both wafers 102W may in various embodiments be different, for example for different purposes in the die package 230, for example for a high side MOSFET and a low side MOSFET, respectively. In various embodiments, both wafers may be identical, but may have different sides surface treated, e.g. roughened or provided with adhesion promoter 222.

The method may include roughening the surface of the frontside metallization 104F of the dies 102 (FIG. 3A, middle left) or of the backside metallization 104B of the dies 102 (FIG. 3A, middle right).

The method may further include singulating the wafer 102W into the plurality of dies 102 by known processes, for example sawing or laser dicing. Only the result is shown in the bottom of FIG. 3A.

In various embodiments, the method may further include placing at least one of the dies 102 into the least one recess 116 of the laminated carrier 106 onto the removable carrier 118 with the roughened surface 224 facing away from the removable carrier 118. This is shown at the top of FIG. 3B.

In various embodiments, the method may further include partially encapsulating the first die 102 such that the first encapsulating material 108 covers at least the metallization 104U facing away from the removable carrier 118, and removing the removable carrier 118 to expose at least a portion of the metallization 104B facing the removable carrier 118 (FIG. 3B, second panel).

In various embodiments, the method may further include surface-treating the metallization 104B facing the removable carrier 118 by roughening the surface. A result is shown in FIG. 3B, third panel.

Alternatively, adhesion promoter material 222 may be formed onto the metallization 104D facing the removable carrier 118 when it is partially exposed.

The options are presented in following table. The table is meant to summarize which of the processes for increasing the adhesion between the metallization 104 and the encapsulating material 108, 112 may be used in combination for a given die 102. This is indicated by entries in the same row. For example, as indicated in the first row, at a wafer level, the frontside metallization 104F and the backside metallization 104B may both be roughened, for example one after the other, e.g. roughening the frontside metallization 104F, re-laminate the wafer onto a new carrier with the roughened frontside, removing the temporary carrier from the backside, and roughening the backside metallization 104B. That the same principle may not be applicable if adhesion promoter 222 is used is indicated in the second row: The adhesion promoter 222 applied to, e.g., the frontside metallization may have such a high adhesion that it may be impossible to remove it from the temporary carrier that would be used for roughening the wafer 102W from the other side. It may be understood that, in many cases, die front side and die back side may be interchangeable.

|  | Die front side | Die back side |
| --- | --- | --- |
| Wafer level | Cu roughening after front side copper plating Adhesion promoter after mounting on a dicing tape before or after dicing Protecting the Cu with organic surface protection layer (e.g. ENTEC, OSP) front side metallization Protecting the Cu with protection layer | Cu roughening after backside copper plating Adhesion promoter after mounting on a dicing tape before or after dicing Protecting the Cu with organic surface protection layer (e.g. ENTEC, OSP) after backside metallization Protecting the Cu with protection layer |
| After die placement (die placed inside the cavity in the PCB core and bonded to the tape) | Adhesion promoter after mounting the dies inside the cavity in the PCB core and bonded to the tape) | Adhesion promoter after mounting the dies inside the cavity in the PCB core and bonded to the tape) Pretreatment of the surface with plasma (Activation the surface by reducing the surface energy) |
| After first lamination (dies are fixed to the Cu core with semicured prepreg or other polymer material) | Cu roughening after front side copper plating Protecting the Cu with organic surface protection layer (e.g. ENTEC, OSP) front side metallization Adhesion promoter after mounting the dies inside the cavity in the PCB core and bonded to the tape) Pretreatment of the surface with plasma (Activation the surface by reducing the surface energy) | Cu roughening after backside copper plating Protecting the Cu with organic surface protection layer (e.g. ENTEC, OSP) backside metallization Adhesion promoter after mounting the dies inside the cavity in the PCB core and bonded to the tape) Pretreatment of the surface with plasma (Activation the surface by reducing the surface energy |

As indicated in the table, at the wafer level, the die metallization 104 (e.g. copper surface) may be either roughened, e.g. using a special microetch process, and protected with a temporary surface treatment that protects the metallization 104 (e.g. the copper surface) from reoxidation or limits the oxide layer growth. After the roughening, the metallization 224, e.g. the (roughened) copper surface, may be protected with an organic surface protection treatment or a similar protection to prevent a reoxidation that might cause reduction in the adhesion strength. In this process, no adhesion promoters or activation may be used, because this process would cause problems between the die and the dicing tape (increased adhesion). The typical roughening (0.5 to 2 µm Rz) process may for example be done for the die backside 104B after backside metallization when the die 102 is still on a glass carrier 118.

As indicated in the table, adhesion promotion may be performed also at a panel level after a die placement or after a not-fully-cured lamination process, also referred to as softlam.

In case the process is done at a panel level, an adhesion promoter process may be used to improve the adhesion between the copper and the encapsulating material. The process may (e.g. have to) be done in two steps. The first process may be done after the dies 102 are placed inside the recesses (core openings) 116 and bonded to the removable carrier 116 (e.g. tape). At this phase, the adhesion promoter 222 (e.g. silane) may be coated (e.g.) sprayed on the top side of the panel. Here, a chemical bonding of the adhesion promoter 222 on one side to the metallizations 104 and on the other side to the encapsulating material 108, 112, (e.g. resin of the laminate, resin sheet, molding resin sheet, prepreg or other polymer material in sheet, liquit or granulat form), may be the mechanism that leads to an increased adhesion. Further improvement of the adhesion may be achieved by a plasma pretreatment, which may precondition the surface in such a manner that you get a reproducible reactive surface for the chemical bonding of the adhesion promoter 222. The adhesion promoter 222 can be applied in an extra process. Alternatively or additionally, the adhesion promoter 222 may be included in the laminate.

The second process of the adhesion promotion at panel level may be needed for the bottom side of the panel. The bottom side of the panel (side that is facing toward the tape 118, i.e. the metallization 104B) may be treated (adhesion promoter, roughening, activation) after prelamination. At this phase normal, a Cu roughening process or the same processes that were described above may be used.

The processes can also be done in such a way that part of the processes are done at wafer level (e.g., the die backside is treated), and a second process may be executed when the dies are bonded and prelaminated inside the carrier 106 (e.g., the die frontside).

Figure 4:
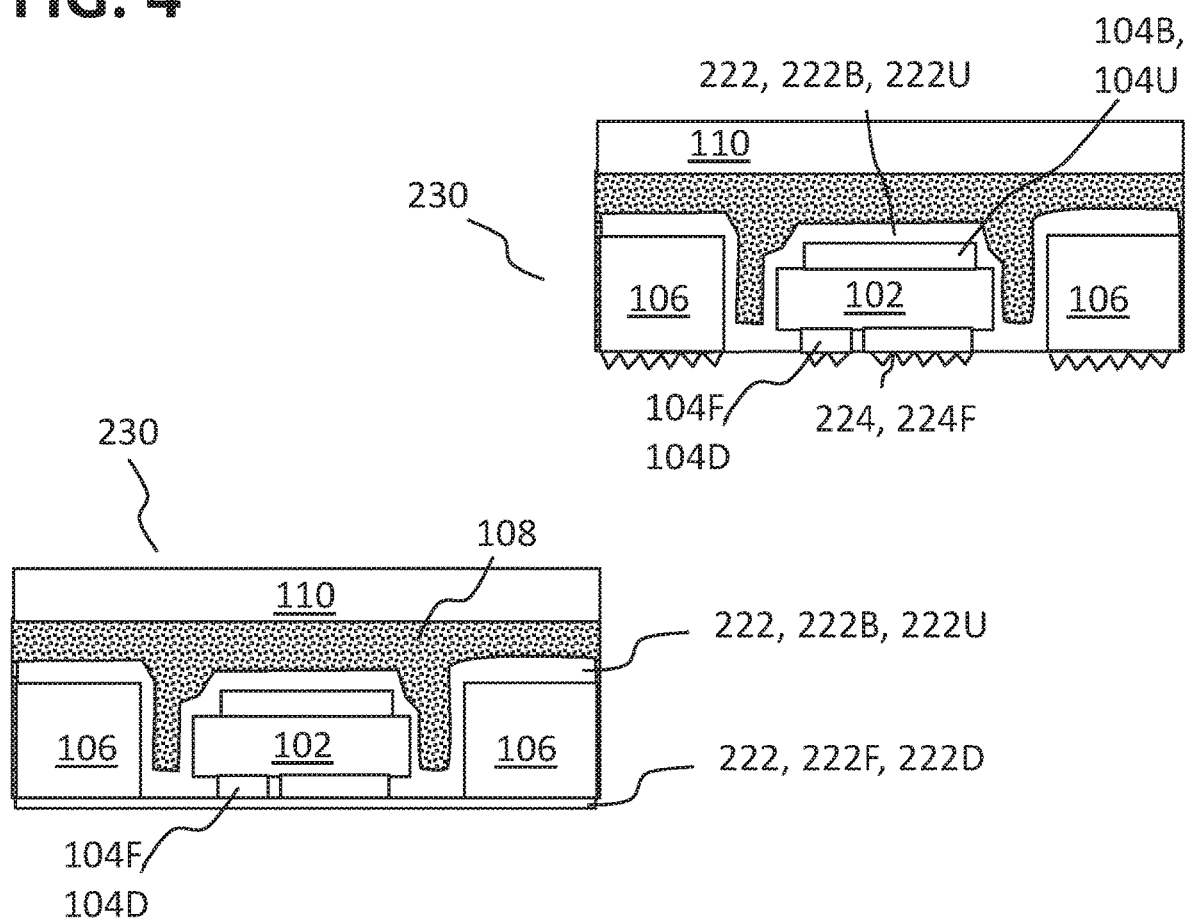
FIG. 4 shows aspects of die packages in accordance with various embodiments.
Figure 4:
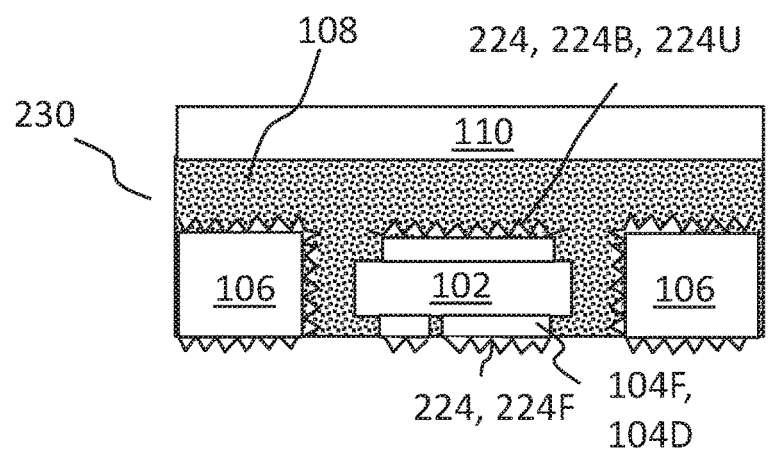
Figure 5A:
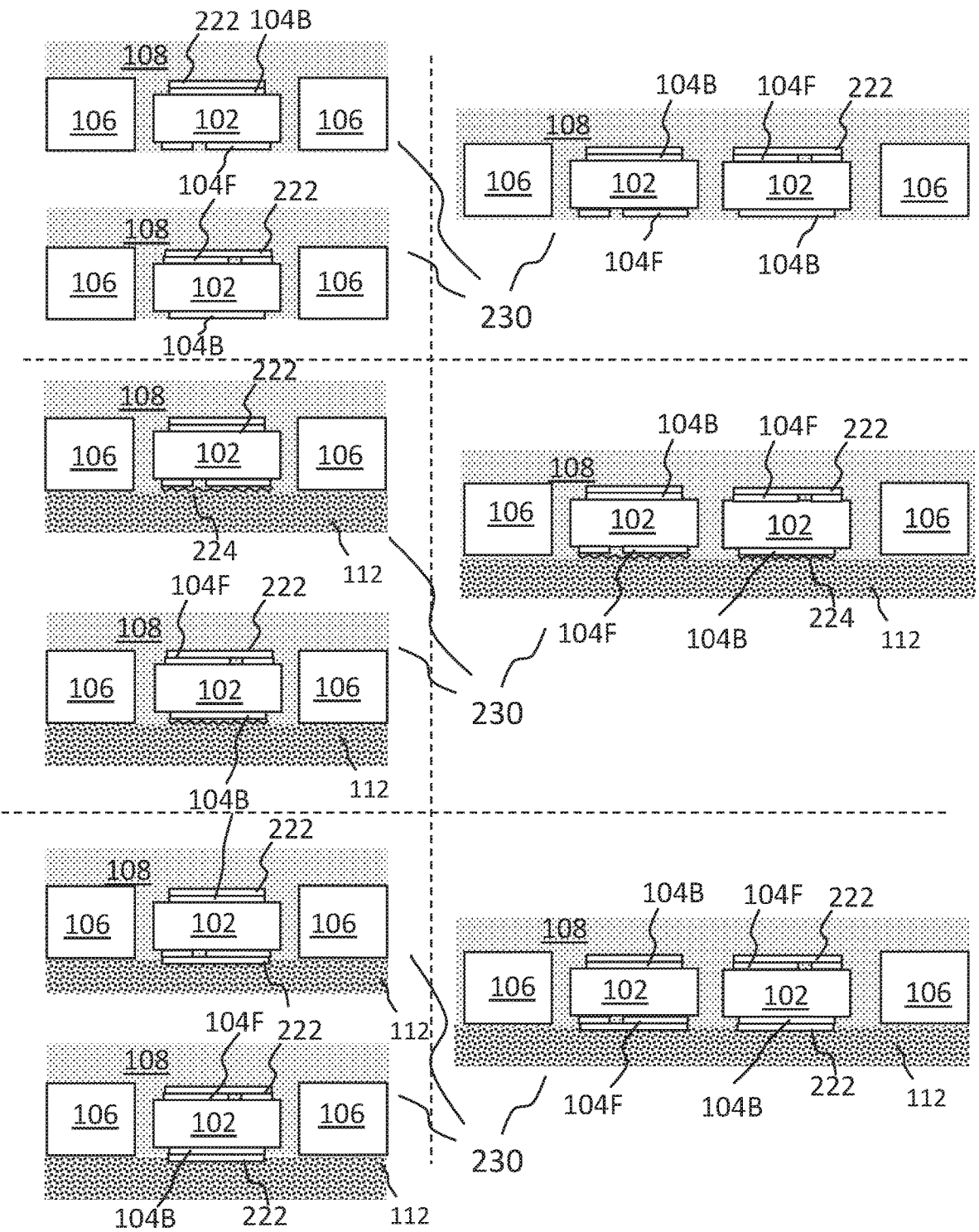

FIG. 4, FIG. 5A and FIG. 5B show die packages 230 in accordance with various embodiments. The die packages 230 may be illustrative for some of the combinations indicated in the table, and/or for some of the embodiments mentioned in context with FIG. 2A and FIG. 2B and/or FIG. 3A and FIG. 3B, but not shown there.

In FIG. 4, the die package 230 shown at the top has the adhesion promoter 222, 222B, 222U between the metallization 104U, which is the backside metallization 104B of the die 102, and the first encapsulation material 108. Additionally, the adhesion promoter 222 covers the rest of the die 102, for example semiconductor material of the die 102 that may be exposed on side surfaces of the die 102, and (side and top surfaces of) the laminated carrier 106. The adhesion promoter 222 may for example have been applied by spraying or dipping, for example during an after-die-placement-process. The metallization 104D exposed at the bottom of the package 230 received the roughening treatment for forming the roughened surface 224, 224F of the metallization 104F, 104D. Second encapsulation material 112 may be arranged over the roughened surface 224, 224F.

The embodiment of the die package 230 shown in the middle of FIG. 4 is similar to the embodiment at the top, except that the metallization 104D exposed at the bottom of the package 230 is covered by adhesion promoter 222, 222F, 222D. Additionally, the laminated carrier 106 and the first encapsulation material 108 are covered by the adhesion promoter 222, 222F, 222D, which may have been applied by spraying or dipping. Second encapsulation material 112 may be arranged over the adhesion promoter 222, 222F, 222D.

The embodiment of the die package 230 shown at the bottom of FIG. 4 has a die 102 with a roughened upward facing bottom metallization 104, 104B, 104U. The roughening may for example have been formed at wafer level. Furthermore, the laminated carrier 106, which may include copper at least at its surface, may be roughened, too, for example in a separate process before having been mounted on the (removed) removable carrier 118. A downward frontside metallization 104F, 104D of the die 102 may have been roughened during an after-softlam-process, thereby forming the roughened metallization 224, 224F. The downward facing surface of the laminated carrier 106 may have been roughened together with its other surfaces, or it may have been roughened during the after-softlam-process.

In FIG. 5A, the top section shows three embodiments of die packages 230 having the adhesion promoter 222 only on the upwards facing metallization 104U. The embodiments on the left have the die 102 in opposite orientations, and the embodiment on the right includes two dies 102, one of which is flipped with respect to the other. The adhesion promoter 222 is selectively applied, for example using a mask or a very fine nozzle, and covers only the metallizations 104U. The bottom metallizations 104B are free from the adhesion promoter 222 and may for example be subjected to a sputtering process for forming a metal layer (not shown), or for example for thickening the metallizations 104D.

The middle section of FIG. 5A shows embodiments that may be die packages 230 after further processing of the die packages 230 shown in the top section. The further processing may include roughening the downward facing metallizations 104D, thereby forming the roughened metallization surfaces 224. After the roughening, the second encapsulation material 112 was formed over the roughened metallization 224.

The bottom section of FIG. 5A shows embodiments that may be die packages 230 after further processing of the die packages 230 shown in the top section. The further processing may include forming the adhesion promoter 222 over the downward facing metallizations 104D. Over the adhesion promoter 222, the second encapsulation material 112 was formed.

In the embodiment shown in the top section of FIG. 5B, the upwards facing metallization 104U is roughened. The roughened metallization 224 may have been formed during a processing at wafer level. The bottom metallizations 104B are free from the adhesion promoter 222 and may for example be subjected to a sputtering process for forming a metal layer (not shown), or for example for thickening the metallizations 104D.

The middle section of FIG. 5B shows embodiments that may be die packages 230 after further processing of the die packages 230 shown in the top section. The further processing may include roughening the downward facing metallizations 104D, thereby forming the roughened metallization surfaces 224. After the roughening, the second encapsulation material 112 was formed over the roughened metallization 224.

The bottom section of FIG. 5A shows embodiments that may be die packages 230 after further processing of the die packages 230 shown in the top section. The further processing may include forming the adhesion promoter 222 over the downward facing metallizations 104D. Over the adhesion promoter 222, the second encapsulation material 112 was formed.

Figure 6:
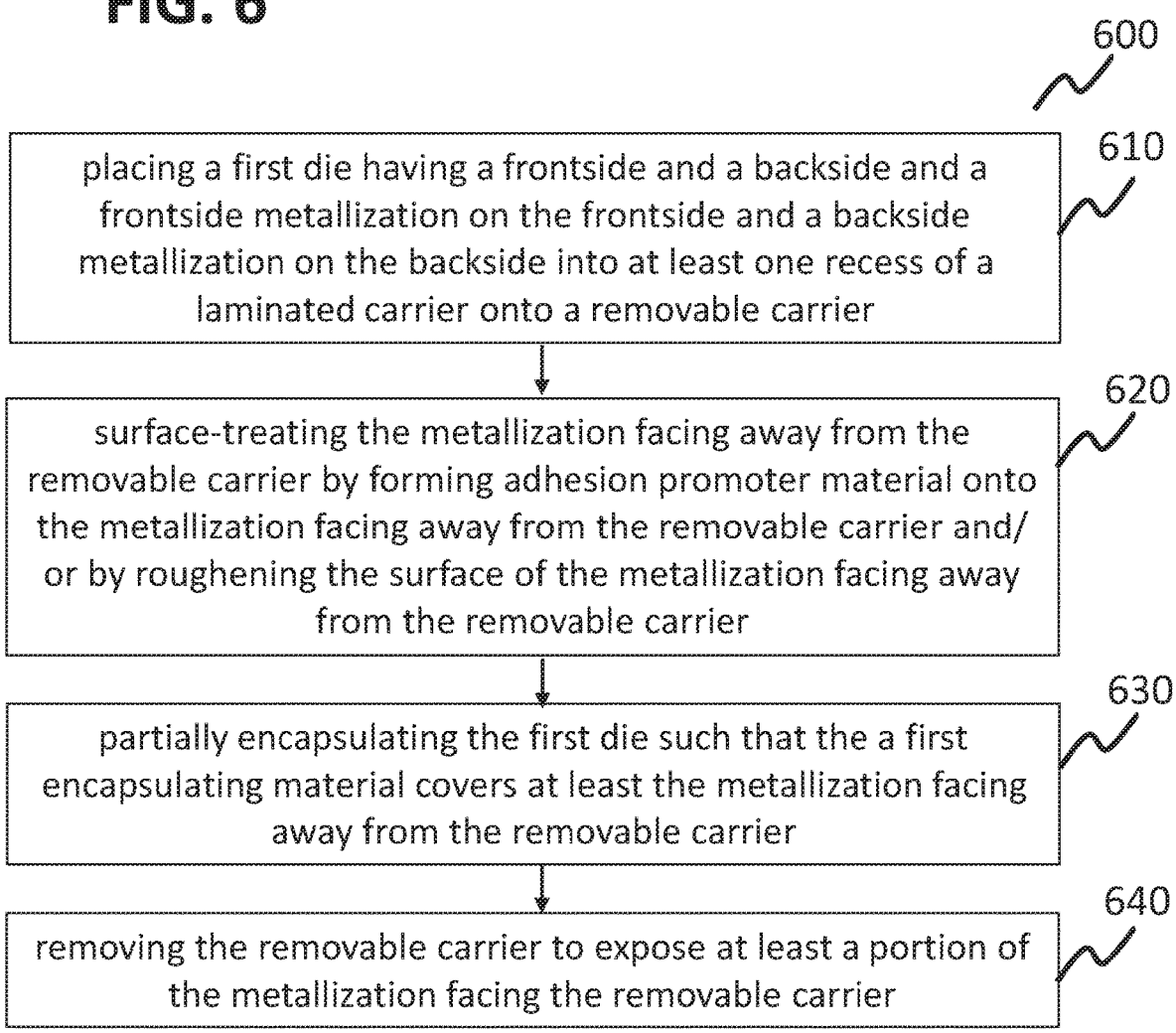
FIG. 6 shows a process flow of a method of manufacturing a die package.

FIG. 6 shows a process flow 600 of a method of manufacturing a die package. The method may include placing a first die having a frontside and a backside and a frontside metallization on the frontside and a backside metallization on the backside into at least one recess of a laminated carrier onto a removable carrier (at 610), surface-treating the metallization facing away from the removable carrier by forming adhesion promoter material onto the metallization facing away from the removable carrier and/or by roughening the surface of the metallization facing away from the removable carrier (at 620), partially encapsulating the first die such that a first encapsulating material covers at least the metallization facing away from the removable carrier (at 630), and removing the removable carrier to expose at least a portion of the metallization facing the removable carrier (at 640).

Figure 7:
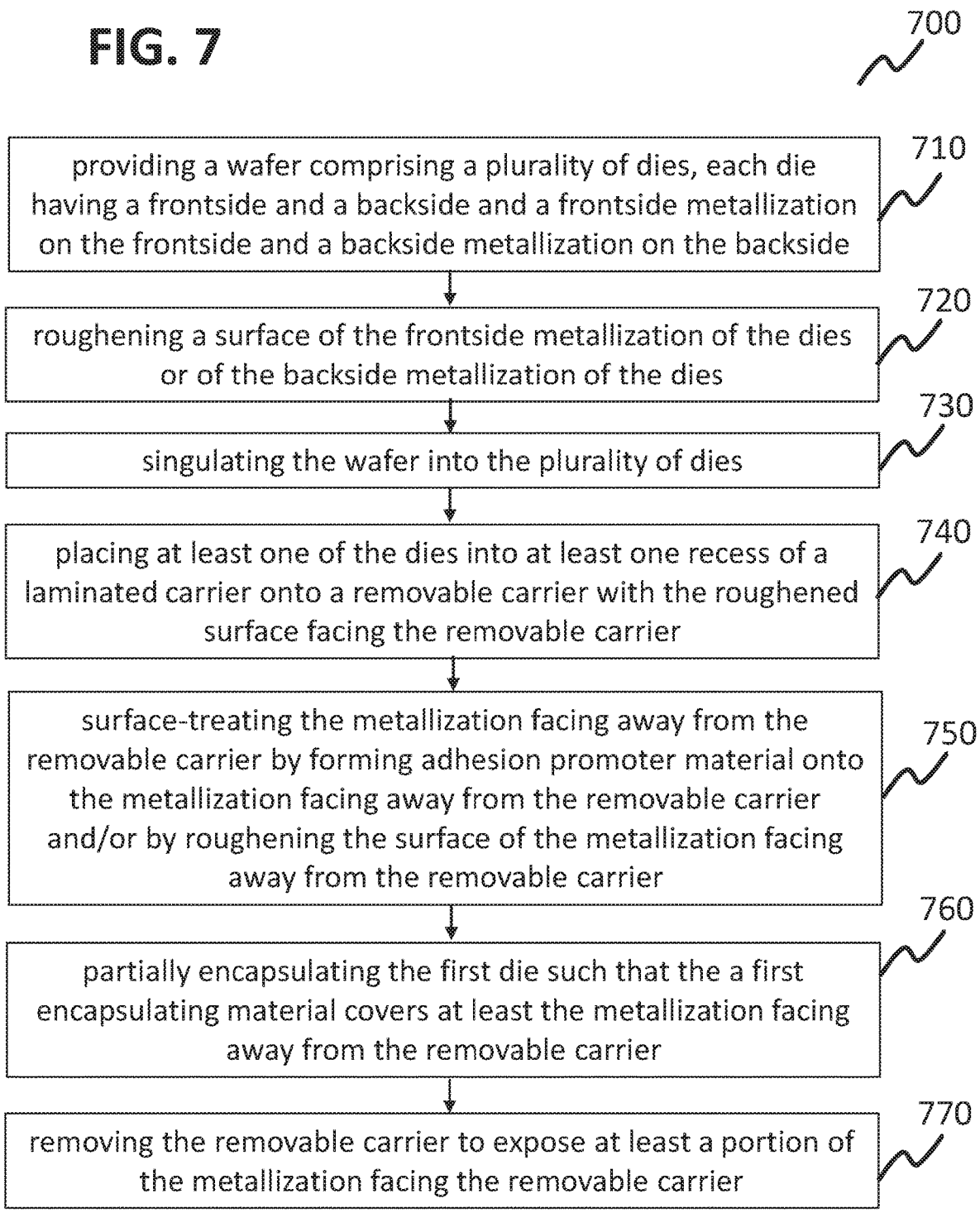
FIG. 7 shows a process flow of a method of manufacturing a die package.

FIG. 7 shows a process flow 700 of a method of manufacturing a die package. The method may include providing a wafer including a plurality of dies, each die having a frontside and a backside and a frontside metallization on the frontside and a backside metallization on the backside (at 710), roughening a surface of the frontside metallization of the dies or of the backside metallization of the dies (at 720), singulating the wafer into the plurality of dies (at 730), placing at least one of the dies into at least one recess of a laminated carrier onto a removable carrier with the roughened surface facing the removable carrier (at 740), surface-treating the metallization facing away from the removable carrier by forming adhesion promoter material onto the metallization facing away from the removable carrier and/or by roughening the surface of the metallization facing away from the removable carrier (at 750), partially encapsulating the first die such that the a first encapsulating material covers at least the metallization facing away from the removable carrier (at 760), and removing the removable carrier to expose at least a portion of the metallization facing the removable carrier (at 770).

Various examples will be illustrated in the following:

Example 1 is a die package. The die package may include a laminated carrier including at least one recess, a first die having a frontside and a backside and a frontside metallization on the frontside and a backside metallization on the backside, wherein the first die is arranged in the at least one recess, a first encapsulating material partially encapsulating the first die covering at least the frontside metallization or the backside metallization, and an adhesion promoter material between the metallization covered by the first encapsulation material and the first encapsulation material and in direct physical contact with the first encapsulation material and the metallization covered by the first encapsulation material.

In Example 2, the subject-matter of Example 1 may optionally include that the other metallization not covered by the encapsulation material is free from the adhesion promoter material.

In Example 3, the subject-matter of Example 1 may optionally further include a second encapsulating material covering the other metallization, wherein the other metallization covered by the second encapsulation material has a surface that is in direct physical contact with the second encapsulating material, wherein the surface of the other metallization is roughened.

In Example 4, the subject-matter of Example 1 may optionally further include a second encapsulating material covering the other metallization and a further adhesion promoter material between the other metallization covered by the second encapsulation material and the second encapsulation material and in direct physical contact with the second encapsulation material and the metallization covered by the first encapsulation material.

In Example 5, the subject-matter of Example 1 may optionally further include a second die having a frontside and a backside and a frontside metallization on the frontside and a backside metallization on the backside, wherein the first die is arranged in the at least one recess with its frontside facing a bottom of the at least one recess, wherein the second die is arranged in the at least one recess with its backside facing the bottom of the at least one recess, and wherein the adhesion promoter is provided on the backside metallization of the first die and on the frontside metallization of the second die.

In Example 6, the subject-matter of Example 5 may optionally further include a second encapsulating material covering the frontside metallization of the first die and the backside metallization of the second die, wherein each of the frontside metallization of the first die and the backside metallization of the second die has a surface that is in direct physical contact with the second encapsulating material, and wherein the frontside metallization of the first die and the backside metallization of the second die are roughened.

In Example 7, the subject-matter of Example 5 may optionally further include a second encapsulating material covering the frontside metallization of the first die and the backside metallization of the second die, and a further adhesion promoter material between the frontside metallization of the first die and the second encapsulation material and in direct physical contact with the second encapsulation material and the frontside metallization, and between the backside metallization of the second die and the second encapsulation material and in direct physical contact with the second encapsulation material and the backside metallization.

Example 8 is a die package. The die package may include a laminated carrier including at least one recess, a first die having a frontside and a backside and a frontside metallization on the frontside and a backside metallization on the backside, a second die having a frontside and a backside and a frontside metallization on the frontside and a backside metallization on the backside, wherein the first die is arranged in the at least one recess with its frontside facing a bottom of the at least one recess, wherein the second die is arranged in the at least one recess with its backside facing the bottom of the at least one recess, and a first encapsulating material partially encapsulating the first die covering at least the frontside metallization or the backside metallization, wherein the backside metallization of the first die has a surface that is in direct physical contact with the first encapsulating material, wherein the surface of the metallization is roughened, and wherein the frontside metallization of the second die has a surface that is in direct physical contact with the first encapsulating material, wherein the surface of the metallization is roughened.

In Example 9, the subject-matter of Example 8 may optionally further include a second encapsulating material covering the frontside metallization of the first die and the backside metallization of the second die, and a further adhesion promoter material between the frontside metallization of the first die and the second encapsulation material and in direct physical contact with the second encapsulation material and the frontside metallization, and between the backside metallization of the second die and the second encapsulation material and in direct physical contact with the second encapsulation material and the backside metallization, In Example 10, the subject-matter of Example 8 may optionally further include a second encapsulating material covering the frontside metallization of the first die and the backside metallization of the second die, wherein each of the frontside metallization of the first die and the backside metallization of the second die has a surface that is in direct physical contact with the second encapsulating material, and wherein the frontside metallization of the first die and the backside metallization of the second die are roughened.

Example 11 is a die package. The die package may include a laminated carrier including at least one recess, a first die having a frontside and a backside and a frontside metallization on the frontside and a backside metallization on the backside, wherein the first die is arranged in the at least one recess, a first encapsulating material partially encapsulating the first die covering at least the frontside metallization or the backside metallization, a second encapsulating material covering the other metallization, and an adhesion promoter material between the metallization covered by the second encapsulation material and the second encapsulation material and in direct physical contact with the second encapsulation material and the metallization covered by the second encapsulation material, wherein the metallization covered by the first encapsulation material has a surface that is in direct physical contact with the first encapsulating material, wherein the surface of the metallization is roughened.

Example 12 is a die package. The die package may include a laminated carrier including at least one recess, a first die having a frontside and a backside and a frontside metallization on the frontside and a backside metallization on e backside, wherein the first die is arranged in the at least one recess, a first encapsulating material partially encapsulating the first die covering at least the frontside metallization or the backside metallization, wherein the metallization covered by the first encapsulation material has a surface that is in direct physical contact with the first encapsulating material, wherein the surface of the metallization is roughened, and a second encapsulating material covering the other metallization, wherein the other metallization covered by the second encapsulation material has a surface that is in direct physical contact with the second encapsulating material, wherein the surface of the other metallization is roughened.

In Example 13, the subject-matter of any of Examples 1 to 12 may optionally include that the frontside metallization and/or the backside metallization includes or consists of copper.

In Example 14, the subject-matter of any Examples 1 to 7 may optionally include that the adhesion promoter includes or consists of an organic material.

In Example 15, the subject-matter of Example 14 may optionally include that the adhesion promoter includes or consists of at least one material of a group of organic materials, the group including an epoxy, a silane, benzotriazole, imidazole, and benzimidazole.

In Example 16, the subject-matter of any of Examples 1 to 7 may optionally include that the adhesion promoter includes or consists of an inorganic material.

In Example 17, the subject-matter of Example 16 may optionally include that the adhesion promoter includes or consists of at least one material of a group of inorganic materials, the group including ZnCr and $Al_2O_3$.

In Example 18, the subject-matter of any of Examples 1 to 17 may optionally further include a first metal layer over the first encapsulating material, and a first electrically conductive structure connecting the first metal layer to the metallization covered by the first encapsulating material.

In Example 18, the subject-matter of any of Examples 3, 4, 6, 7, 9, 10, 11 or 12 may optionally further include a second metal layer over the second encapsulating material and a second electrically conductive structure connecting the second metal layer to the metallization covered by the second encapsulating material.

In Example 20, the subject-matter of any of Examples 1 to 19 may optionally include that the laminated carrier is a printed circuit board.

In Example 21, the subject-matter of any of Examples 1 to 20 may optionally include that the first die is a power electronic device.

In Example 22, the subject-matter of any of Examples 1 to 21 may optionally include that the first die is a transistor or a diode.

In Example 23, the subject-matter of any of Examples 1 to 22 may optionally include that the first die is a transistor, and wherein the frontside metallization includes a control terminal and a first controlled terminal of the transistor, and the backside metallization includes a second controlled terminal of the transistor.

In Example 24, the subject-matter of any of Examples 5 to 10 may optionally include that the second die forms a driver circuit for the first die.

In Example 25, the subject-matter of any of Examples 5 to 10 may optionally include that the first die and the second die are arranged in the same recess.

In Example 26, the subject-matter of any of Examples 1 to 25 may optionally further include a third die.

In Example 27, the subject-matter of any of Examples 5 to 10 may optionally further include a third die, wherein the at least one recess includes the recess, in which the first die is arranged, and at least one further recess, wherein the first die and the third die are arranged in the recess, and wherein the second die is arranged in the further recess.

In Example 28, the subject-matter of Example 27 may optionally include that the first die and the second die are transistors, and wherein the third die includes a control circuit.

In Example 29, the subject-matter of any of Examples 1 to 28 may optionally further include wherein the adhesion promoter material is additionally in direct physical contact with a semiconductor surface and/or a dielectric surface of the die.

In Example 24, the subject-matter of any of Examples 4, 7, or 9 may optionally include that the further adhesion promoter material is additionally in direct physical contact with a semiconductor surface and/or a dielectric surface of the die.

In Example 31, the subject-matter of any of Examples 1 to 30 may optionally include that the laminated carrier includes copper.

Example 32 is a method of manufacturing a die package. The method may include placing a first die having a frontside and a backside and a frontside metallization on the frontside and a backside metallization on the backside into at least one recess of a laminated carrier onto a removable carrier, surface-treating the metallization facing away from the removable carrier by forming adhesion promoter material onto the metallization facing away from the removable carrier and/or by roughening the surface of the metallization facing away from the removable carrier, partially encapsulating the first die such that a first encapsulating material covers at least the metallization facing away from the removable carrier, and removing the removable carrier to expose at least a portion of the metallization facing the removable carrier.

In Example 33, the subject-matter of Example 32 may optionally further include surface-treating the exposed portion of the metallization by forming further adhesion promoter material onto the exposed portion of the metallization and/or by roughening a surface of the exposed portion of the metallization, and arranging a second encapsulating material over the surface-treated metallization.

In Example 34, the subject-matter of Example 32 may optionally further include arranging a second die having a frontside and a backside and a frontside metallization on the frontside and a backside metallization on the backside in the at least one recess with its backside facing a bottom of the at least one recess, wherein the first die is arranged in the at least one recess with its frontside facing the bottom of the at least one recess, wherein the adhesion promoter is provided on the backside metallization of the first die and on the frontside metallization of the second die, and/or the backside metallization of the first die and the frontside metallization of the second die are roughened.

In Example 35, the subject-matter of Example 34 may optionally further include arranging a second encapsulating material covering the frontside metallization of the first die and the backside metallization of the second die, wherein each of the frontside metallization of the first die and the backside metallization of the second die has a surface that is in direct physical contact with the second encapsulating material and is roughened, and/or has a further adhesion promoter material arranged between the surface and the second encapsulation material and in direct physical contact with the second encapsulation material.

In Example 36, the subject-matter of any of Examples 32 to 35 may optionally include that the surface-treating the metallization facing away from the removable carrier is performed while the die is part of a wafer.

In Example 37, the subject-matter of any of Examples 32 to 36 may optionally include that the surface-treating the metallization facing away from the removable carrier includes the roughening, and that the roughening includes etching.

In Example 38, the subject-matter of any of Examples 32 to 37 may optionally include that the surface-treating the metallization facing away from the removable carrier includes the roughening, and that the surface of the metallization facing away from the removable carrier after the roughening has a surface roughness between about 150 nm and about 2 μm.

In Example 39, the subject-matter of any of Examples 32 to 38 may optionally include that the surface-treating the metallization facing away from the removable carrier includes the roughening, wherein the method further includes applying an oxidation protection layer to the roughened metallization.

In Example 40, the subject-matter of any of Examples 32 to 36 may optionally include that the surface-treating the metallization facing away from the removable carrier includes the forming adhesion promoter material onto the metallization, and that the forming adhesion promoter material onto the metallization includes spraying the adhesion promoter material onto the metallization or dipping the metallization into the adhesion promoter material.

In Example 41, the subject-matter of any of Examples 32 to 36 or 40 may optionally include that the surface-treating the metallization facing away from the removable carrier includes the forming adhesion promoter material onto the metallization, wherein the method further includes, before the forming adhesion promoter material onto the metallization, plasma treating the metallization to reduce a surface energy of a surface of the metallization.

In Example 42, the subject-matter of any of Examples 33 to 41 may optionally include that the surface-treating the exposed portion of the metallization includes the roughening, and that the roughening includes etching.

In Example 43, the subject-matter of any of Examples 33 to 42 may optionally include that the surface-treating the exposed portion of the metallization includes the roughening, and that the roughened exposed portion of the metallization after the roughening has a surface roughness between about 150 nm and about 2 μm.

In Example 44, the subject-matter of any of Examples 33 to 43 may optionally include that the surface-treating the exposed portion of the metallization includes the roughening, the method further including applying an oxidation protection layer to the roughened metallization.

In Example 45, the subject-matter of any of Examples 32 to 36 may optionally include that the surface-treating the exposed portion of the metallization includes the forming adhesion promoter material onto the metallization, and that the forming adhesion promoter material onto the metallization includes spraying the adhesion promoter material onto the metallization or dipping the metallization into the adhesion promoter material.

In Example 46, the subject-matter of any of Examples 32 to 36 or 40 may optionally include that the surface-treating the exposed portion of the metallization includes the forming adhesion promoter material onto the metallization, the method further including, before the forming adhesion promoter material onto the metallization, plasma treating the exposed portion of the metallization to reduce a surface energy of a surface of the metallization.

In Example 47, the subject-matter of Example 32 may optionally further include sputter depositing a metal layer on the exposed portion of the metallization.

Example 48 is a method of manufacturing a die package. The method may include providing a wafer including a plurality of dies, each die having a frontside and a backside and a frontside metallization on the frontside and a backside metallization on the backside, roughening a surface of the frontside metallization of the dies or of the backside metallization of the dies, singulating the wafer into the plurality of dies, placing at least one of the dies into at least one recess of a laminated carrier onto a removable carrier with the roughened surface facing the removable carrier, surface-treating the metallization facing away from the removable carrier by forming adhesion promoter material onto the metallization facing away from the removable carrier and/or by roughening the surface of the metallization facing away from the removable carrier, partially encapsulating the first die such that the a first encapsulating material covers at least the metallization facing away from the removable carrier, and removing the removable carrier to expose at least a portion of the metallization facing the removable carrier.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A die package, comprising:
a laminated carrier comprising at least one recess;
a first die arranged in the at least one recess and comprising a frontside, a backside, a frontside metallization on the frontside and a backside metallization on the backside;
a first encapsulating material partially encapsulating the first die by covering at least the frontside metallization or the backside metallization; and
an adhesion promoter material between the metallization covered by the first encapsulation material and the first encapsulation material, and in direct physical contact with the first encapsulation material and the metallization covered by the first encapsulation material.

2. The die package of claim 1, further comprising:
a second encapsulating material covering the metallization that is not partially encapsulated by the first encapsulating material,
wherein the metallization covered by the second encapsulation material has a roughened surface that is in direct physical contact with the second encapsulating material.

3. The die package of claim 1, further comprising:
a second encapsulating material covering the metallization that is not partially encapsulated by the first encapsulating material; and
a further adhesion promoter material between the metallization covered by the second encapsulation material and the second encapsulation material, and in direct physical contact with the second encapsulation material and the metallization covered by the second encapsulation material.

4. The die package of claim 1, further comprising:
a second die comprising a frontside of the second die, a backside of the second die, a frontside metallization on the frontside of the second die and a backside metallization on the backside of the second die,
wherein the first die is arranged in the at least one recess with its frontside facing a bottom of the at least one recess,
wherein the second die is arranged in the at least one recess with its backside facing the bottom of the at least one recess, and
wherein the adhesion promoter is provided on the backside metallization of the first die and on the frontside metallization of the second die.

5. The die package of claim 4, further comprising:
a second encapsulating material covering the frontside metallization of the first die and the backside metallization of the second die,
wherein each of the frontside metallization of the first die and the backside metallization of the second die has a surface that is in direct physical contact with the second encapsulating material, and
wherein the frontside metallization of the first die and the backside metallization of the second die are roughened.

6. The die package of claim 4, further comprising:
a second encapsulating material covering the frontside metallization of the first die and the backside metallization of the second die; and
a further adhesion promoter material between the frontside metallization of the first die and the second encapsulation material and in direct physical contact with the second encapsulation material and the frontside metallization of the first die, and between the backside metallization of the second die and the second encapsulation material and in direct physical contact with the second encapsulation material and the backside metallization of the second die.

7. The die package of claim 1, wherein the first die is a transistor, and wherein the frontside metallization comprises a control terminal and a first controlled terminal of the transistor, and the backside metallization comprises a second controlled terminal of the transistor.

8. The die package of claim 1, wherein the adhesion promoter material is additionally in direct physical contact with a semiconductor surface and/or a dielectric surface of the first die.

9. A die package, comprising:
a laminated carrier comprising at least one recess;
a first die comprising a frontside, a backside, a frontside metallization on the frontside and a backside metallization on the backside, the first die being arranged in the at least one recess with its frontside facing a bottom of the at least one recess
a second die comprising a frontside of the second die, a backside of the second die, a frontside metallization on the frontside of the second die and a backside metallization on the backside of the second die, the second die being arranged in the at least one recess with its backside facing the bottom of the at least one recess; and
a first encapsulating material partially encapsulating the first die by covering at least the frontside metallization or the backside metallization of the first die, wherein the backside metallization of the first die has a roughened surface that is in direct physical contact with the first encapsulating material, wherein the frontside metallization of the second die has a roughened surface that is in direct physical contact with the first encapsulating material.

10. The die package of claim 9, further comprising:

a second encapsulating material covering the frontside metallization of the first die and the backside metallization of the second die; and a further adhesion promoter material between the frontside metallization of the first die and the second encapsulation material and in direct physical contact with the second encapsulation material and the frontside metallization of the first die, and between the backside metallization of the second die and the second encapsulation material and in direct physical contact with the second encapsulation material and the backside metallization of the second die.

11. The die package of claim 9, further comprising:

a second encapsulating material covering the frontside metallization of the first die and the backside metallization of the second die, wherein each of the frontside metallization of the first die and the backside metallization of the second die has a surface that is in direct physical contact with the second encapsulating material, and wherein the frontside metallization of the first die and the backside metallization of the second die are each roughened.

12. The die package of claim 9, wherein the first die is a transistor, and wherein the frontside metallization of the first die comprises a control terminal and a first controlled terminal of the transistor, and the backside metallization of the first die comprises a second controlled terminal of the transistor.

13. A die package, comprising:

a laminated carrier comprising at least one recess;

a first die arranged in the at least one recess and comprising a frontside, a backside, a frontside metallization on the frontside and a backside metallization on the backside;

a first encapsulating material partially encapsulating the first die by covering at least the frontside metallization or the backside metallization;

a second encapsulating material covering the metallization that is not partially encapsulated by the first encapsulating material; and an adhesion promoter material between the metallization covered by the second encapsulation material and the second encapsulation material, and in direct physical contact with the second encapsulation material and the metallization covered by the second encapsulation material, wherein the metallization covered by the first encapsulation material has a roughened surface that is in direct physical contact with the first encapsulating material.

14. The die package of claim 13, wherein the adhesion promoter material comprises at least one material selected from the group consisting of:

an epoxy;
a silane;
benzotriazole;
imidazole; and
benzimidazole.

15. A die package, comprising:

a laminated carrier comprising at least one recess;

a first die arranged in the at least one recess and comprising a frontside, a backside, a frontside metallization on the frontside and a backside metallization on the backside;

a first encapsulating material partially encapsulating the first die by covering at least the frontside metallization or the backside metallization, the metallization covered by the first encapsulation material having a roughened surface that is in direct physical contact with the first encapsulating material; and a second encapsulating material covering the metallization that is not partially encapsulated by the first encapsulating material, the metallization covered by the second encapsulation material having a roughened surface that is in direct physical contact with the second encapsulating material.

16. The die package of claim 15, wherein the first die is a transistor, and wherein the frontside metallization comprises a control terminal and a first controlled terminal of the transistor, and the backside metallization comprises a second controlled terminal of the transistor.

* * * * *

UNITED STATES PATENT AND TRADEMARK OFFICE
CERTIFICATE OF CORRECTION

| | | |
|---|---|---|
| PATENT NO. | : 12,033,909 B2 | Page 1 of 1 |
| APPLICATION NO. | : 16/909575 | |
| DATED | : July 9, 2024 | |
| INVENTOR(S) | : P. Palm et al. | |

It is certified that error appears in the above-identified patent and that said Letters Patent is hereby corrected as shown below:

On the Title Page

Item (57)/abstract (Line 7), please change "die, by" to -- die by --.

Signed and Sealed this
Twenty-fifth Day of February, 2025

Coke Morgan Stewart
*Acting Director of the United States Patent and Trademark Office*